United States Patent
Tange

(10) Patent No.: US 6,639,232 B1
(45) Date of Patent: Oct. 28, 2003

(54) PATTERN WRITING METHOD EMPLOYING ELECTRON BEAM WRITING DEVICE OF VARIABLE-SHAPED VECTOR SCAN SYSTEM

(75) Inventor: Koji Tange, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/301,600

(22) Filed: Nov. 22, 2002

(30) Foreign Application Priority Data

Jul. 8, 2002 (JP) .................................. 2002-198208

(51) Int. Cl.[7] ................................................ H01J 37/08
(52) U.S. Cl. ........................... 250/492.22; 250/492.3; 250/492.23
(58) Field of Search ............................ 250/492.1, 492.2, 250/492.21, 492.22, 492.23, 492.24, 492.3; 430/296

(56) References Cited

U.S. PATENT DOCUMENTS 4,625,121 A * 11/1986 Hamaguchi .............. 250/492.2
6,040,114 A * 3/2000 Inoue et al. .............. 430/296

FOREIGN PATENT DOCUMENTS

JP 2-31414 2/1990

* cited by examiner

*Primary Examiner*—John R. Lee
*Assistant Examiner*—James P. Hughes
(74) *Attorney, Agent, or Firm*—Oblon, Spivak, McClelland, Maier & Neustadt, P.C.

(57) ABSTRACT

A first region of an object (10) to be written corresponding to a shot region (H1) is irradiated with an electron beam (11) for a standard shot period (T1). A pattern (M1) is thereby written in the first region of the object (10) to be written. Next, a second region of the object (10) to be written corresponding to a shot region (H2) is irradiated with the electron beam (11) for a shot period (T2) which is determined according to the shot size of the second region. A pattern (M2) is thereby written in the second region of the object (10) to be written. Owing to the correction of shot period, the finished dimension of the pattern M2 is the same as the designed dimension thereof with respect to the Y direction.

2 Claims, 10 Drawing Sheets

F I G . 1
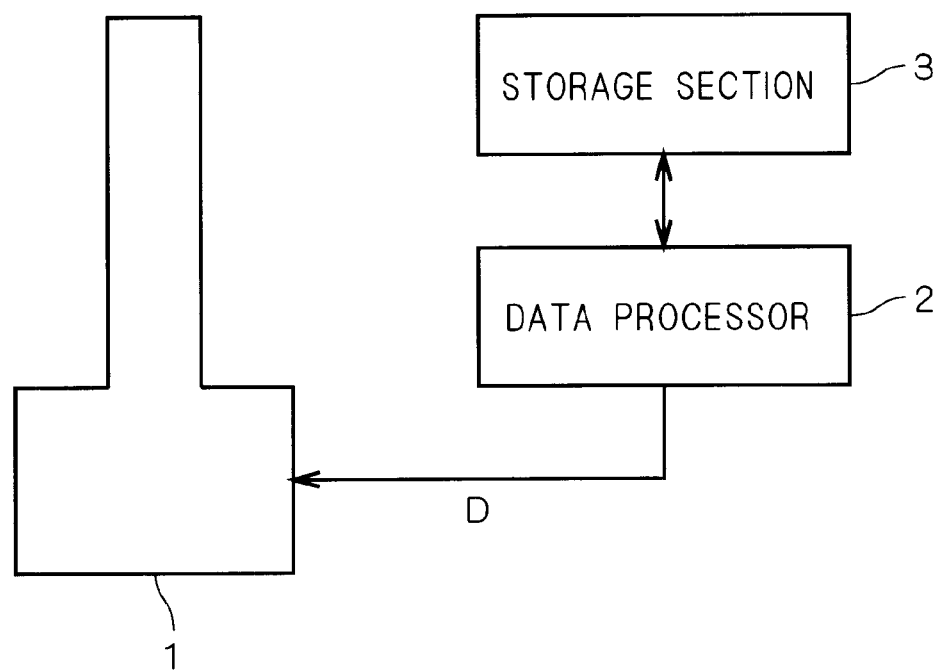

| SHOT SIZE S | SHOT PERIOD T |
|---|---|
| S1 | T1 |
| S2 | T2 |
| S3 | T3 |
| ⋮ | ⋮ |

PATTERN WRITING METHOD EMPLOYING ELECTRON BEAM WRITING DEVICE OF VARIABLE-SHAPED VECTOR SCAN SYSTEM

BACKGROUND OF THE INVENTION

1. Field of the Invention

The present invention relates to a pattern writing method for writing a pattern on a photomask or on a semiconductor substrate, for example. More particularly, it relates to a pattern writing method employing an electron beam writing device of variable-shaped vector scan system.

2. Description of the Background Art

FIGS. 12A, 12B and 12C are schematic views illustrating a pattern writing method in the background art employing an electron beam writing device of variable-shaped vector scan system. For writing a pattern F illustrated in FIG. 12A, a first shot is given to write a pattern in a rectangular region F1 (FIG. 12B) and thereafter, a second shot is given to write a pattern in a rectangular region F2 contiguous with the region F1 (FIG. 12C). The pattern F is thereby obtained as a combination of the two rectangular patterns. The irradiation time period with electron beam (hereinafter referred to as "shot period") for writing the pattern in the region F1 and the shot period for writing the pattern in the region F2 are the same.

When a plurality of shots are given to write a pattern, a deviation of the finished dimension of the pattern from the designed dimension thereof may occur. Especially when the pattern writing method involves the step of writing the pattern in the region F2 by giving a small shot size W in a Y direction as shown in FIG. 12C, the finished dimension of the pattern F is determined to be larger than the designed dimension thereof. This deviation supposedly results from different beam profiles of electron beams used for irradiating the regions F1 and F2, from variation in current density for each shot size, and the like. In FIGS. 12A through 12C, a vertical and horizontal directions in the plane of the drawing are defined as "X direction" and "Y direction", respectively.

A shot rank correction is known as a technique for compensating for deviation of the finished dimension caused by the shot size. More particularly, in the shot rank correction, the shot period (namely, the amount of dose) is varied according to the shot size and then pattern is written, thus compensating for the deviation. FIGS. 13A and 13B illustrate the shot rank correction technique. With reference to FIG. 13A, assuming that an isolated pattern is to be written, the dimension of an electron beam with respect to the Y direction for writing the isolated pattern is defined as a shot size S. In FIG. 13B, the horizontal axis of the graph shows the shot size S, and the vertical axis shows a deviation G. The deviation G is calculated by subtracting the designed dimension of the pattern from the finished dimension thereof with respect to the Y direction. It is seen from FIG. 13B that within the particular range where the shot size S has a small value, the finished dimension is smaller than the designed dimension. This result is caused by proximity effect. When a pattern is written with the shot size S2 and with the standard amount of dose bearing characteristic Q1, for example, a deviation –G1 is generated accordingly. This deviation –G1 is compensated for by giving the amount of dose bearing characteristic Q2 that is larger than the standard amount. The amount of dose to be corrected for each shot size S is obtained through experiment, for example.

According to the foregoing shot rank correction, when the finished dimension of the pattern is smaller than the designed dimension thereof, the amount of dose larger than the standard amount is given. As a result, a deviation of the finished dimension can be compensated for. In contrast, according to the pattern writing method in the background art illustrated in FIGS. 12A through 12C, the finished dimension of the pattern F is larger than the designed dimension thereof as described. Therefore, a deviation of the finished dimension of the pattern written by the background-art method cannot be compensated for by the shot rank correction.

SUMMARY OF THE INVENTION

When a pattern is to be written by giving a plurality of shots, it is an object of the resent invention to realize a pattern writing method suitably compensating for a deviation of the finished dimension of the pattern from the designed dimension thereof.

The pattern writing method of the present invention includes the following steps (a) and (b). In the step (a), a first region of an object to be written is irradiated with an electron beam for a first period, to write a first pattern having a fist side extending in a first direction, and a second side extending in a second direction. The step (b) is performed separately from the step (a). In the step (b), a second region of the object to be written is irradiated with an electron beam for a second period shorter than the first period, to write a second pattern having a first side overlapping the first side of the first pattern, and a second side extending in the second direction. The second side of the second pattern has a dimension of not more than a predetermined threshold value.

When the second pattern is written to have the second side of not more than the predetermined threshold value, the irradiation period with an electron beam is shortened. As a result, a deviation of the finished dimension of the pattern from the designed dimension thereof can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram schematically illustrating the general configuration of a pattern writing device according to a preferred embodiment of the present invention;

DESCRIPTION OF THE PREFERRED EMBODIMENTS

FIG. 1 is a block diagram schematically illustrating the general configuration of the pattern writing device according to the preferred embodiment of the present invention. The pattern writing device of the preferred embodiment includes an electron beam writing device 1 of variable-shaped vector scan system, a data processor 2, and a storage section 3.

Figure 2A:
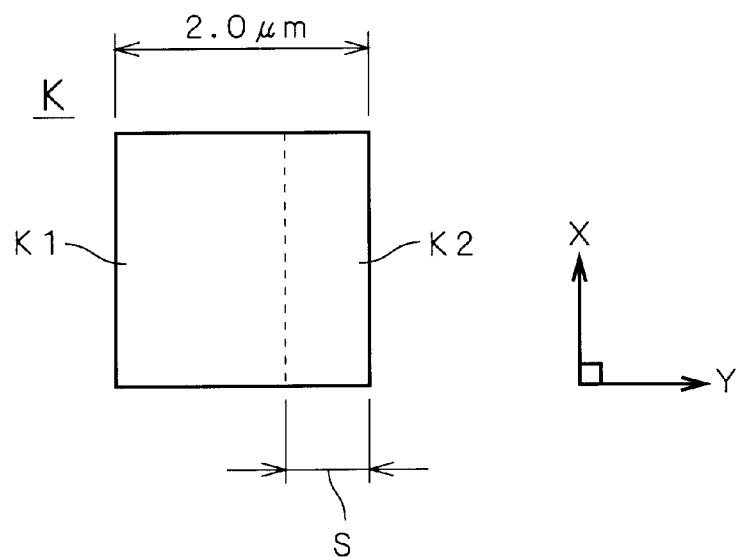
FIGS. 2A, 2B, FIG. 3 and FIG. 4 illustrate data stored in a storage section.

FIGS. 2A, 2B, FIG. 3 and FIG. 4 illustrate data stored in the storage section 3. As described, when a plurality of shots are given to write a pattern, the finished dimension of the pattern may be larger than the designed dimension thereof depending on the shot size. In light of this, the range of the shot size affecting the finished dimension is calculated first. FIG. 2A illustrates a pattern K having a constant value in designed dimension with respect to the Y direction. In FIG. 2A, the designed dimension of the pattern K with respect to the Y direction is shown to be the same as the maximum shot size which is 2.0 $\mu$m, for example. The pattern K is written by giving two shots. More particularly, a first shot is given to write a pattern K1 and a second shot is given to write a pattern K2. Changing a shot size S to have various values, the finished dimension of the pattern K with respect to the Y direction is measured for each value of the shot size S. Here, the shot size S is defined as a dimension of the second shot with respect to the Y direction, which is equal to the designed dimension of the pattern K2 with respect to the Y direction. Further, a shot period T is a standard period T1 both for writing the pattern K1 and for writing the pattern K2.

Figure 2B:
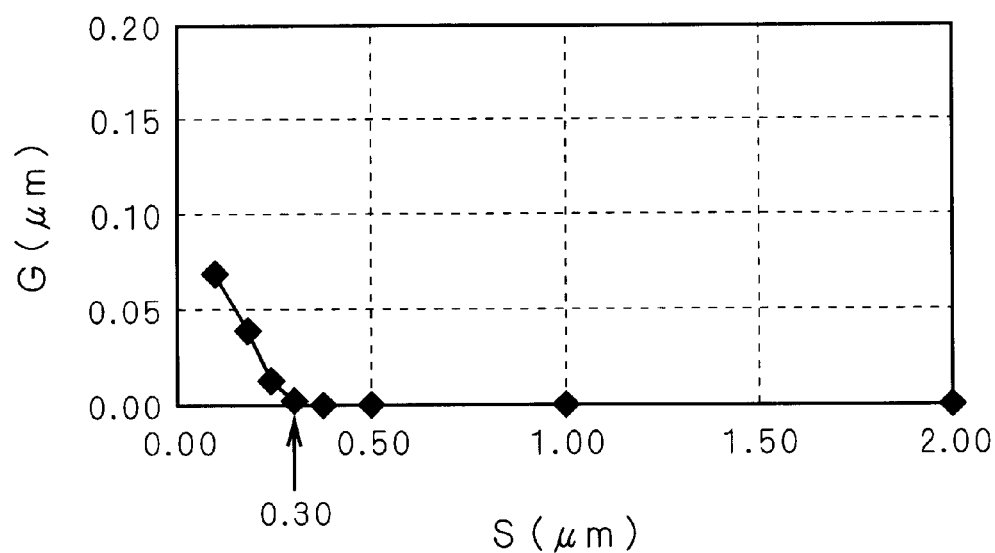

Next, on the basis of the result of the foregoing experimental measurement, the graph shown in FIG. 2B is drawn. In FIG. 2B, the horizontal axis of the graph shows the shot size S ($\mu$m), and the vertical axis shows a deviation G ($\mu$m). The deviation G is calculated by subtracting the designed dimension of the pattern K (here, 2.0 $\mu$m) from the finished dimension thereof with respect to the Y direction. It is seem from FIG. 2B that in the range where the shot size S is 0.3 $\mu$m or less, the deviation G increases as the shot size S becomes smaller. That is, by giving the shot size S which is 0.3 $\mu$m or less, the finished dimension will be affected. In view of this, a threshold value S0 of the shot size, from which compensation is required, is defined as 0.3 $\mu$m.

Figures 3, 4:
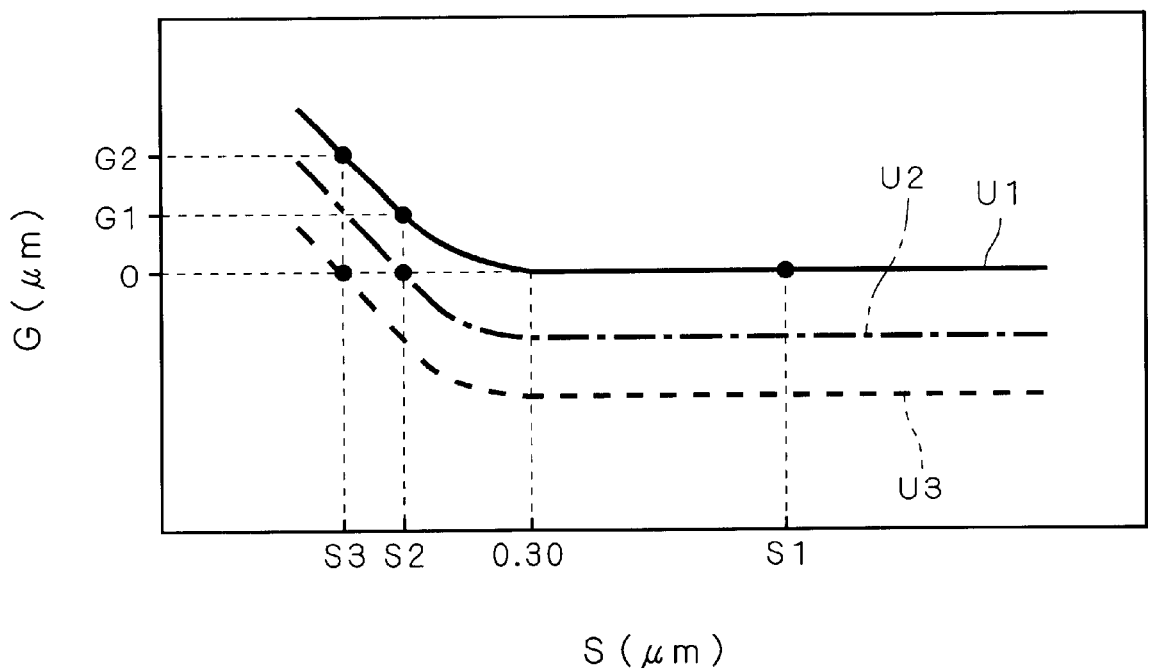

Next, the shot period T for writing the pattern K2 is gradually shortened and the experimental measurement as described is performed. As a result, the amount of correction of shot period, capable of canceling the deviation G, is determined for each shot size S. In this measurement, the shot period T for writing the pattern K1 is still the standard period T1. With reference to FIG. 3, characteristic U1 is the one obtained by electron beam irradiation for the standard shot period T1. Further, characteristics U2 and U3 are those obtained by electron beam irradiation for shot periods T2 and T3, respectively. The shot periods T2 and T3 are both shorter than the standard period T1. As seen from FIG. 3, when the shot size S has a value S2 ($\mu$m), a deviation G1 is cancelled by electron beam irradiation for the shot period T2 bearing the characteristic U2. Further, when the shot size S has a value S3 ($\mu$m), a deviation G2 is cancelled by electron beam irradiation for the shot period T3.

On the basis of the graph shown in FIG. 3, a correction table 4 shown in FIG. 4 is thereafter drawn. The correction table 4 provides correlation between the shot size S and the shot period T capable of canceling the deviation G in the case of beam irradiation with this shot size S. The storage section 3 illustrated in FIG. 1 stores data on the correction table 4.

Figure 5:
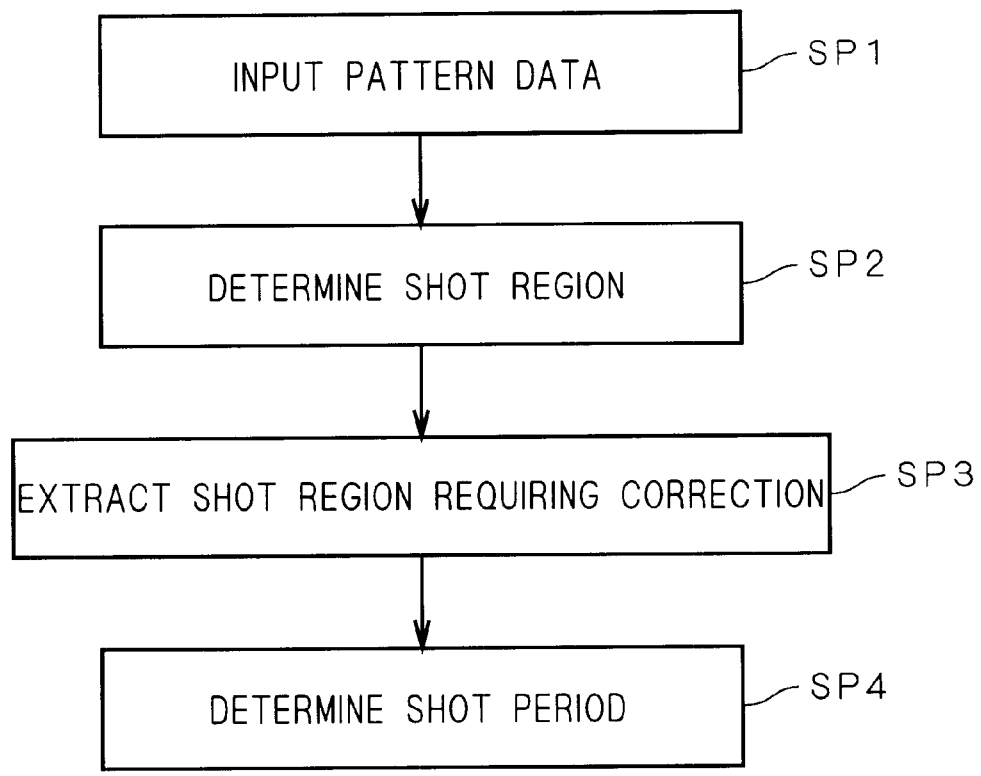
FIG. 5 is a flow chart showing a pattern writing method according to the preferred embodiment of the present invention.

FIG. 5 is a flow chart and FIGS. 6A through 6D are schematic views, each illustrating the pattern writing method of the preferred embodiment. With reference to FIG. 1, FIG. 5 and FIGS. 6A through 6D, the pattern writing method of the preferred embodiment will be described following the sequence of the steps thereof. The correction table shown in FIG. 4 is already stored in the storage section 3.

Figure 6A:
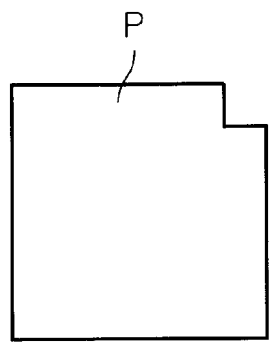
FIGS. 6A through 6D are schematic views illustrating the pattern writing method according to the preferred embodiment of the present invention.

In step SP1, configuration data on a pattern to be written (hereinafter referred to as "to-be-written pattern") is inputted first from outside to the data processor 2. FIG. 6A illustrates an example of a to-be-written pattern P. In step SP1, data on the foregoing threshold value S0 of the shot size and data on position coordinates of the to-be-written pattern are further inputted to the data processor 2. In addition to these data, data on the standard shot period T1 may be further inputted to the data processor 2.

Figure 6B:
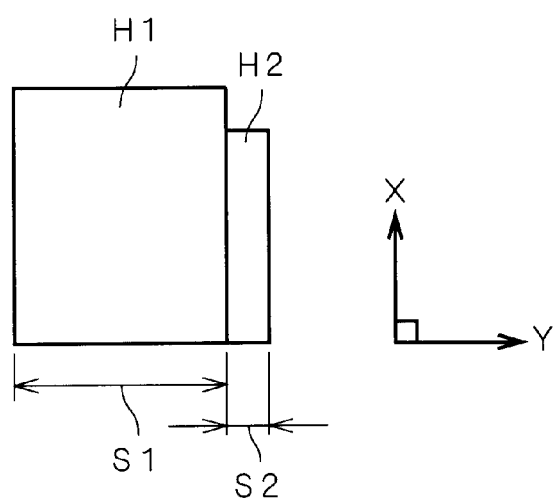

In step SP2, the data processor 2 thereafter defines a shot region for pattern writing on the basis of the data on the to-be-written pattern. Here, the "shot region" means a region to be patterned by one shot. Even when the designed dimension of the to-be-written pattern is not more than the maximum shot size, the to-be-written pattern may not be written by one shot. In this case, the to-be-written pattern is divided into a plurality of contiguous shot regions. With reference to FIG. 6B, the to-be-written pattern P is divided into contiguous shot regions H1 and H2, which are to be patterned by separate shots.

Figure 6C:
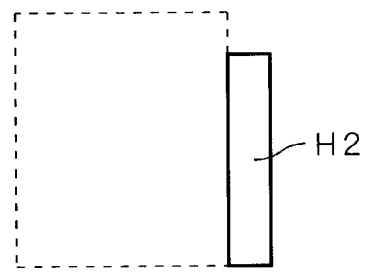
Figure 6D:
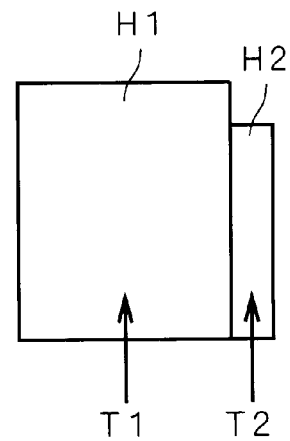

Next, in step SP3, the data processor 2 extracts a shot region, which should undergo correction of shot period, from the plurality of shot regions. When the finished dimension of a pattern becomes larger than the designed dimension thereof resulting from division of the pattern into a plurality of shot regions, the shot period is shortened. The "correction of shot period" referred to here means this shortening of the shot period. In the following, such correction will be called as "correction necessitated by shot division". On the basis of the threshold value S0 of the shot size, the data processor 2 extracts a shot region which is not more than 0.3 $\mu$m in shot size with respect to the Y direction. The shot size S2 of the shot region H2 is smaller than 0.3 $\mu$m and therefore, the shot region H2 is extracted as the one requiring the correction necessitated by shot division as shown in FIG. 6C.

More particularly, the data processor 2 extracts a shot region satisfying both the following conditions R1 and R2 as the one requiring the correction necessitated by shot division. The condition R1 requires that the shot size of an arbitrary side of a shot region should be not more than the threshold value S0. The condition R2 requires that except for this arbitrary side and the side opposite thereto, a side of the same shot region should be in contact with other shot region.

Figure 7:
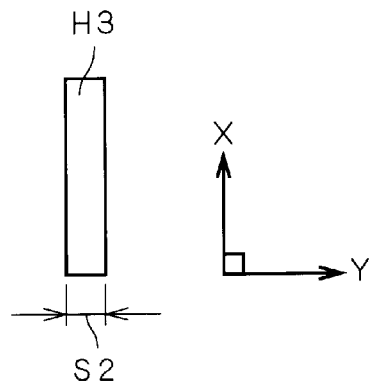
FIGS. 7 through 9 are schematic views each illustrating exemplary extraction of shot region.
Figure 8:
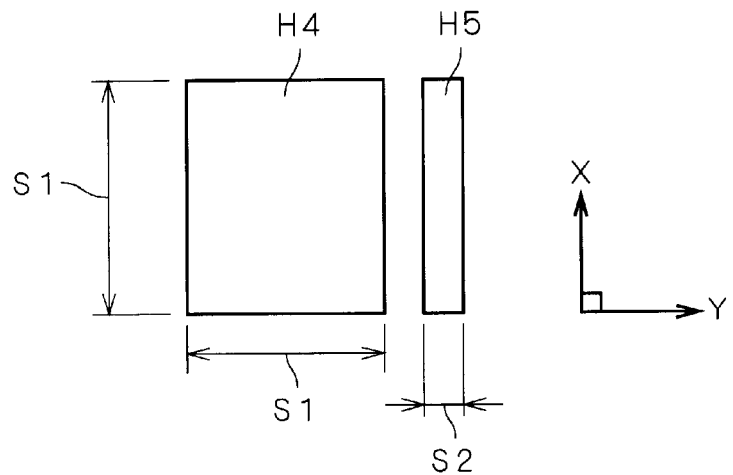
Figure 9:
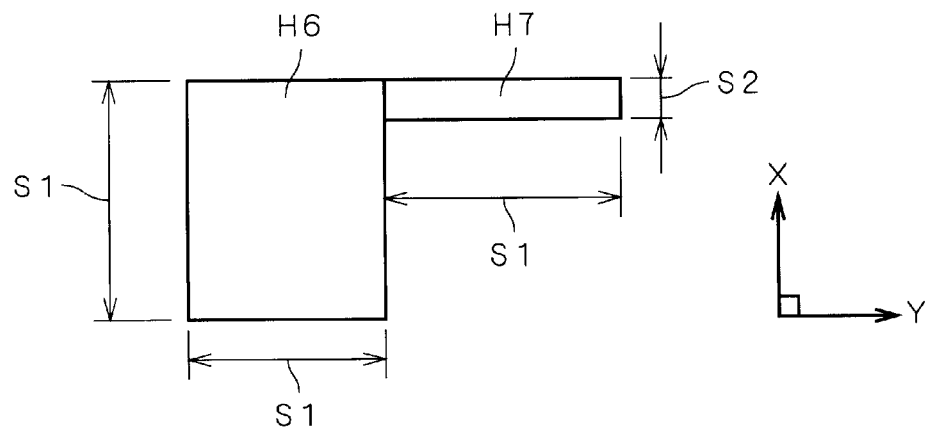

FIGS. 7 through 9 are schematic views each illustrating exemplary extraction of shot region. In FIG. 7, a shot region H3 corresponding to an isolated pattern is shown. The shot region H3 is not more than 0.3 $\mu$m in shot size with respect to the Y direction. In FIG. 8, a shot region H4 and a shot region H5 separated from the shot region H4 are shown. The shot region H4 is greater than 0.3 $\mu$m in shot size with respect to both the X and Y directions. The shot region H5 is not more than 0.3 $\mu$m in shot size with respect to the Y direction. In FIG. 9, a shot region H6 and a shot region H7 contiguous with the shot region H6 are shown. The shot region H6 is greater than 0.3 $\mu$m in shot size with respect to both the X and Y directions. The shot region H7 is not more than 0.3 $\mu$m in shot size with respect to the X direction. The shot regions H4 and H6 do not satisfy the condition R1 and therefore, are not extracted as those requiring the correction necessitated by shot division. The shot regions H3, H5 and H7 do not satisfy the condition R2 and therefore, are not extracted as those requiring the correction necessitated by shot division.

Subsequent to step SP3, in step SP4, the data processor 2 determines the shot period for each shot region. More particularly, referring to the correction table 4 stored in the storage section 3, the data processor 2 determines the shot period T for each shot region to comply with the shot size S thereof. As seen from FIG. 6D, the shot period for the shot region H1 having the shot size S1 is defined as the standard shot period T1, and the shot period for the shot region H2 having the shot size S2 is defined as the shot period T2. The correlation between the shot region and the shot period is inputted as data D from the data processor 2 to the storage section 3, and stored in the storage section 3.

Figure 10:
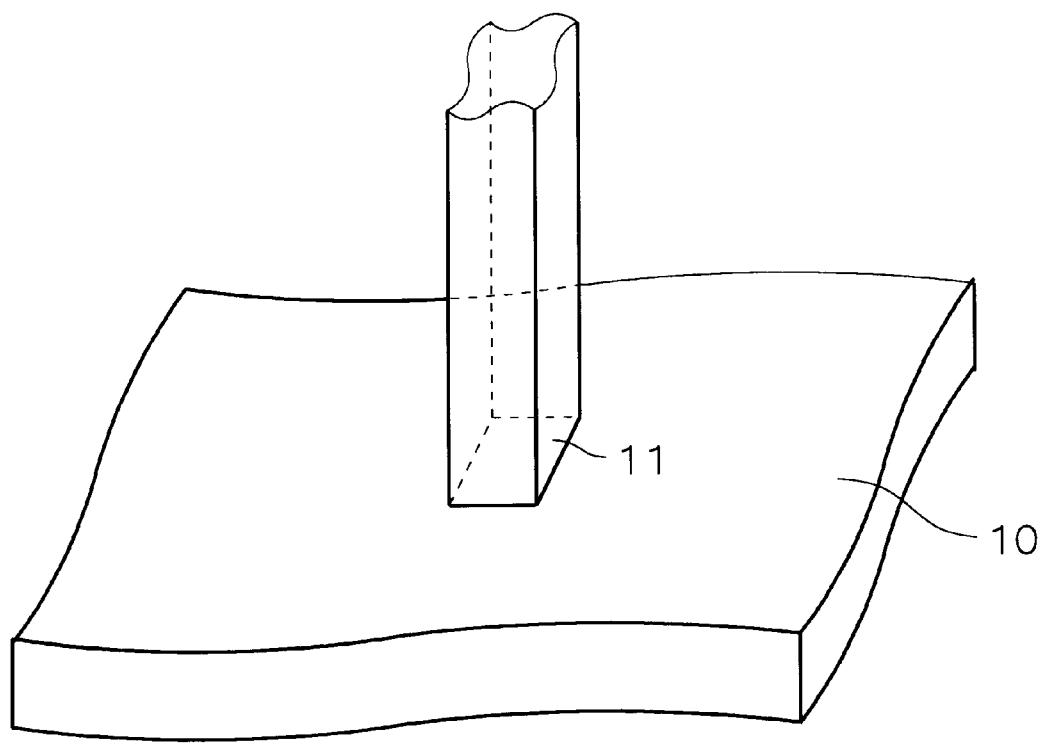
FIG. 10 is a perspective view illustrating how a pattern is written by an electron beam writing device.

With reference to FIG. 1, the data D is also inputted from the data processor 2 to the electron beam writing device 1. On the basis of the data D inputted thereto, the electron beam writing device 1 performs writing of a pattern. FIG. 10 is a perspective view illustrating how a pattern is written by the electron beam writing device 1. An object 10 to be written such as a mask substrate is mounted on a stage (not shown). The object 10 to be written is irradiated with an electron beam 11.

Figure 11A:
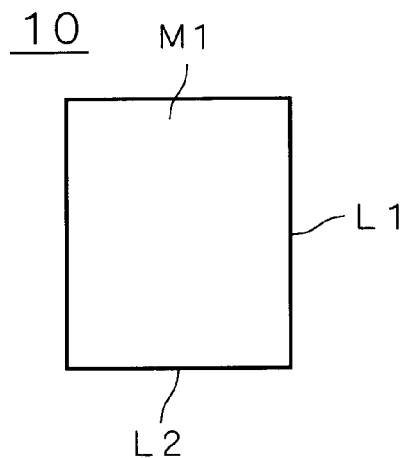
FIGS. 11A and 11B are schematic views illustrating the steps of writing a pattern on an object.
Figure 11B:
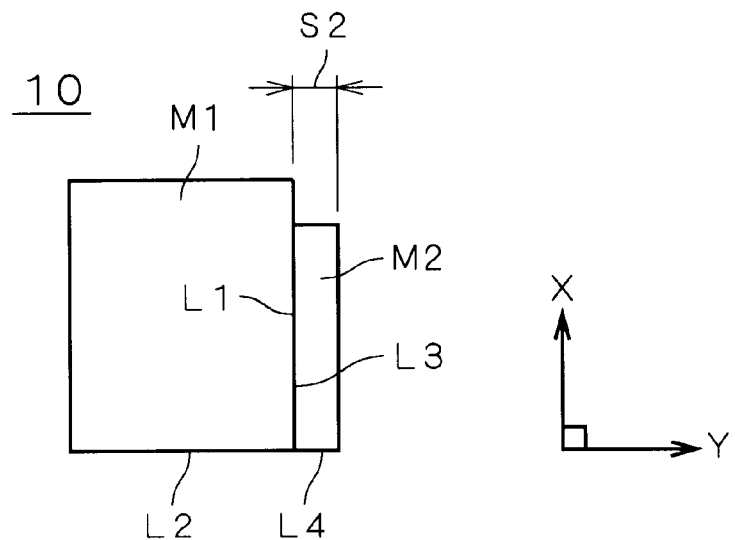
Figure 12A:
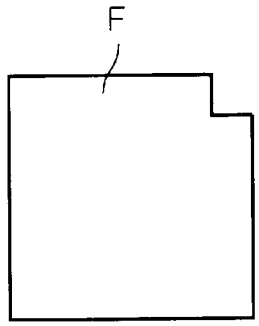
FIGS. 12A, 12B and 12C are schematic views illustrating the pattern writing method in the background art.
Figure 12B:
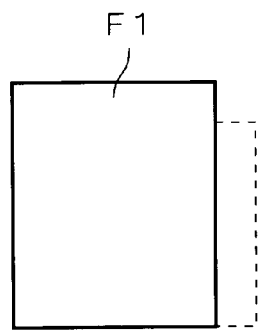
Figure 12C:
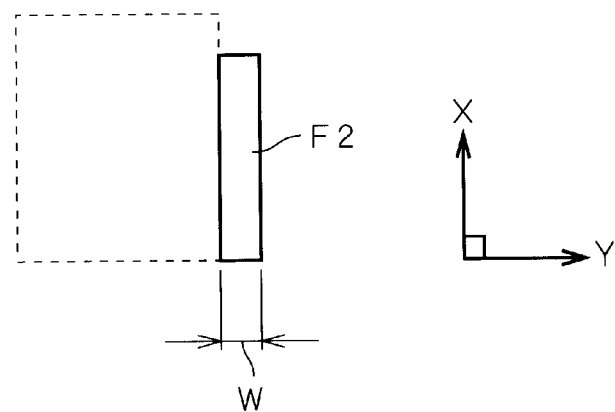
Figure 13A:
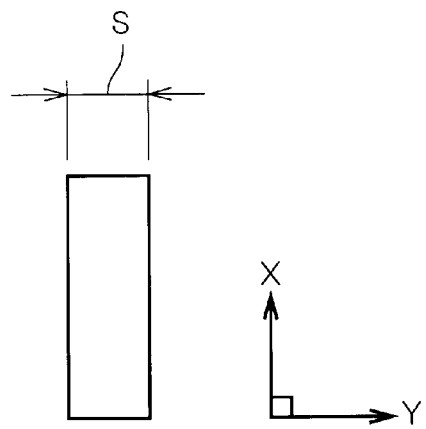
FIGS. 13A and 13B illustrate the shot rank correction technique.
Figure 13B:
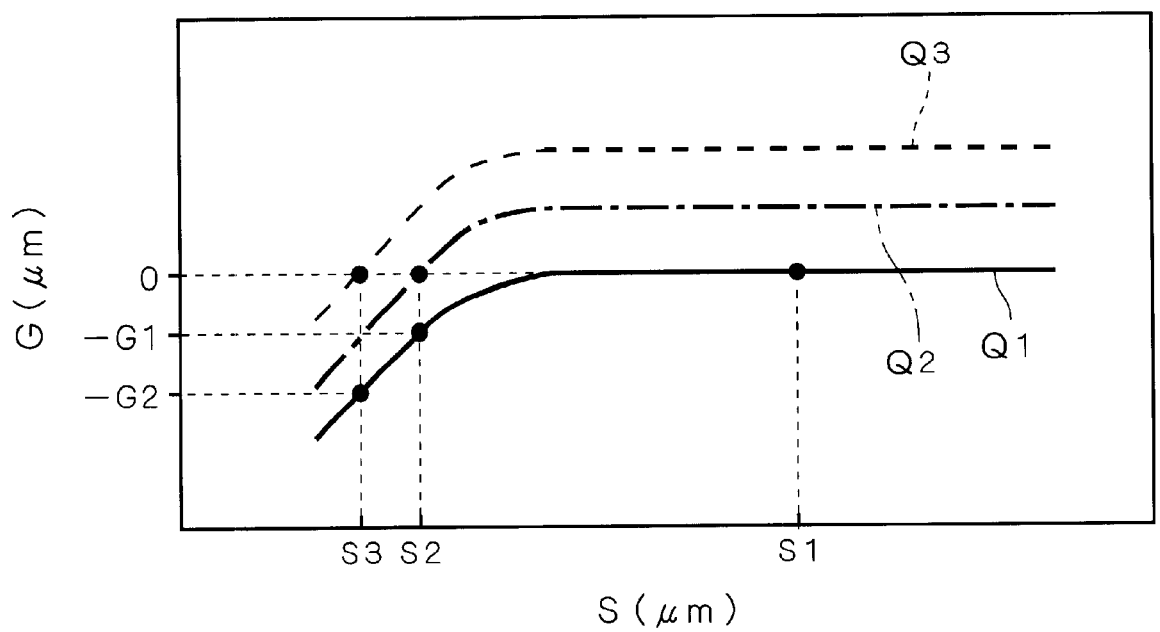

FIGS. 11A and 11B are schematic views corresponding to FIGS. 6A through 6D for illustrating the steps of writing a pattern on the object 10. With reference to FIG. 11A, a region of the object 10 corresponding to the shot region H1 shown in FIG. 6B (hereinafter referred to as "a first region") is irradiated first with the electron beam 11 for the standard shot period T1. As a result, a pattern M1 is written in the first region of the object 10. The pattern M1 has a side L1 extending in the X direction, and a side L2 extending in the Y direction.

With reference to FIG. 11B, a region of the object 10 corresponding to the shot region H2 shown in FIG. 6C (hereinafter referred to as "a second region") is thereafter irradiated with the electron beam 11 for the shot period T2. Here, the second region is defined as the one contiguous with the side L1 of the pattern M1. As a result, a pattern M2 is written in the second region of the object 10. The pattern M2 has a side L3 extending in the X direction, and a side L4 extending in the Y direction. The side L3 of the pattern M2 overlaps the side L1 of the pattern M1. Owing to the correction of shot period, the finished dimension of the pattern M2 with respect to the Y direction is the same as the designed dimension thereof (namely, the shot size S2 of the shot region H2 with respect to the Y direction).

In the description given so far, the pattern M1 is written first and thereafter, the pattern M2 is written. Alternatively, the pattern M2 may be written first prior to the writing of the pattern M1.

In a lithography process as one of the manufacturing processes of a semiconductor device, using a photomask formed by the electron beam writing device 1 and using KrF excimer laser as light for exposure, for example, reduction projection exposure is performed on a photoresist provided on a semiconductor substrate. Alternatively, without providing a photomask, a pattern may be written with an electron beam directly on a semiconductor substrate. In this case, the object 10 to be pattern illustrated in FIG. 10 is a semiconductor substrate.

As described, according to the pattern writing method of the preferred embodiment, when a to-be-written pattern is divided into a plurality of contiguous shot regions which are to be patterned by separate shots, and one of those shot regions has a shot size which is not more than a threshold value, a shot period is shortened for this shot region according to the shot size thereof. As a result, a deviation of the finished dimension of the pattern from the designed dimension thereof can be reduced.

Further, it is desirable to prepare various versions of the correction table 4 according to the types of a photoresist and types of a light shielding film of a photomask, for example. In this case, according to the type of the photoresist as employed, for example, the data processor 2 selects a suitable one from the various versions of the correction table 4 in step SP4 of the flow chart shown in FIG. 5.

Further, in addition to the correction necessitated by shot division, the data processor 2 may give further consideration to other corrections such as proximity effect correction and fogging correction, to determine shot period for each shot region.

Still further, among the shot regions excluded from the extraction for performing the correction necessitated by shot division, those requiring the shot rank correction (for example, the shot regions H3, H5 and H7 illustrated in FIGS. 7 through 9) may be subjected to the shot rank correction.

While the invention has been shown and described in detail, the foregoing description is in all aspects illustrative and not restrictive. It is therefore understood that numerous modifications and variations can be devised without departing from the scope of the invention.

What is claimed is:

1. A pattern writing method, comprising the steps of:
    (a) irradiating a first region of an object to be written with an electron beam for a first period, to write a first pattern having a first side extending in a first direction, and a second side extending in a second direction; and
    (b) to be performed separately from said step (a), irradiating a second region of said object to be written with an electron beam for a second period shorter than said first period, to write a second pattern having a first side overlapping said first side of said first pattern, and a second side extending in said second direction, said second side of said second pattern having a dimension of not more than a predetermined threshold value.

2. The method according to claim 1, wherein said threshold value is 0.3 $\mu$m.

* * * * *